United States Patent [19]
Mori

[11] Patent Number: 5,365,202
[45] Date of Patent: Nov. 15, 1994

[54] PLL FREQUENCY SYNTHESIZER USING PLURAL PHASE COMPARISONS

[75] Inventor: Kazuhiro Mori, Hyogo, Japan

[73] Assignee: Mitsubishi Denki Kabushiki Kaisha, Tokyo, Japan

[21] Appl. No.: 40,281

[22] Filed: Mar. 30, 1993

[30] Foreign Application Priority Data

Apr. 15, 1992 [JP] Japan .................... 4-119869

[51] Int. Cl.$^5$ .................... H03L 7/087; H03L 7/18
[52] U.S. Cl. ........................ 331/12; 331/17; 331/25
[58] Field of Search .................... 331/11, 12, 17, 25

[56] References Cited

U.S. PATENT DOCUMENTS

| | | | |
|---|---|---|---|
| 3,571,743 | 3/1971 | Menkes | 331/11 |
| 4,888,564 | 12/1989 | Ishigaki | 331/1 A |
| 5,113,152 | 5/1992 | Norimatsu | 331/111 |

FOREIGN PATENT DOCUMENTS

| | | |
|---|---|---|
| 0520590 | 12/1992 | European Pat. Off. . |
| 0526227 | 2/1993 | European Pat. Off. . |
| 48-42660 | 6/1973 | Japan . |
| 4866958 | 9/1993 | Japan . |

Primary Examiner—Siegfried H. Grimm
Attorney, Agent, or Firm—Rothwell, Figg, Ernst & Kurz

[57] ABSTRACT

In a phase locked loop frequency synthesizer having multiple feedback loops, a reference phase signal is developed into two signals having a frequency twice as high as the reference frequency and the phase difference of the two signals is a half wavelength. The output frequency produced by a voltage-controlled oscillator is divided by two frequency dividers in accordance with predetermined frequency division factors. Each of the frequency-divided signals and each of the developed signals are subjected to phase comparison in pairs. A voltage signal corresponding to the phase differences is fed through a low-pass filter and supplied to the voltage-controlled oscillator.

2 Claims, 5 Drawing Sheets

PLL FREQUENCY SYNTHESIZER USING PLURAL PHASE COMPARISONS

BACKGROUND OF THE INVENTION

1. Field of the Invention

The present invention relates to a frequency synthesizer using a phase locked loop (will be termed "PLL" hereinafter).

2. Description of the Prior Art

FIG. 4 shows in block diagram a conventional PLL frequency synthesizer disclosed in the publication "Basics and Applications of PLL", written by Teruo Kadota, published by the Publication Department of the Electric College of Tokyo. In the figure, reference numeral 1 denotes a fixed-frequency oscillator, 2 is a frequency divider which divides a constant frequency generated by the oscillator 1 to produce a reference phase signal $f_r$, and 3 is a phase comparator which compares an output phase signal $f_p$ of a programmable frequency divider 7 with the reference phase signal $f_r$ and uses the comparison output to control a charge pump 4. Indicated by 5 is a low-pass filter (will be termed "LPF" hereinafter) which smoothes the output of the charge pump 4, and 6 is a voltage-controlled variable-frequency oscillator (will be termed "VCO" hereinafter). The programmable frequency divider 7 divides the output frequency of the VCO 6 to produce the please signal $f_p$.

Next, the conventional PLL frequency synthesizer arranged as described above will be explained. The fixed-frequency oscillator 1 has its output fed to the frequency divider 2, by which the oscillation frequency is divided. For the reference phase signal (reference frequency) $f_r$ of the frequency divider 2 and the frequency division factor N of the programmable frequency divider 7, the phase signal $f_o$ produced by the VCO 6 is related with the phase signal $f_p$ produced by the programmable frequency divider 7 as: $f_o = f_p \times N$.

The phase comparator 3 controls the charge pump 4 to have a high output impedance when $f_p$ is equal to $f_r$, to have a positive output voltage (supply voltage) when $f_p$ is higher than $f_r$, or to have a ground voltage when $f_p$ is lower than $f_r$. The LPF 5 is formed of a lag-lead filter, RC filter, active filter, or the like, and it smoothes the output of the charge pump 4. The smoothed output is fed to the VCO 6. The VCO 6 is designed to raise or lower its output frequency in response to an increase or decrease, respectively, of the input voltage (output voltage of LPF 5).

In the case of $f_r = f_o/N$, the charge pump 4 is in the high output impedance state, causing the LPF output to be unvaried, i.e., the input voltage to the VCO 6 is unvaried and it does not vary the output frequency, and the relation $f_r = f_o/N$ is kept unchanged.

In the case of $f_r > f_o/N$, the charge pump 4 produces a positive output voltage, which is applied to the LPF 5, causing it to supply an increased voltage to the VCO 6. Consequently, the output frequency of the VCO 6 rises, and the value of $f_o/N$ increases.

In the case of $f_r < f_o/N$, the charge pump 4 produces a ground (zero) voltage, which is applied to the LPF 5, causing it to supply a decreased voltage to the VCO 6. Consequently, the output frequency of the VCO 6 falls, and the value of $f_o/N$ decreases.

Accordingly, a negative feedback loop is formed for the phase of the signal, and the operation settles when the output frequency of the VCO 6 becomes equal to N times the output frequency (reference frequency) of the frequency divider 2, i.e., $f_o = f_p \times N$.

The phase comparator 3 operates continuously even in the steady state (the programmable frequency divider 7 has a constant division factor N and the VCO 6 has a constant output frequency). It is not possible to maintain a constant output voltage $V_f$ of the LPF, but instead the voltage $V_f$ continues to fall due to the power loss of the resistive components of the LPF 5, which is a $\pi$-connection of resistors R1, R2 and R3 and capacitors C1 and C2 for example as shown in FIG. 5.

The VCO frequency also falls continuously, and the charge pump 4 operates to charge the LPF 5 by producing a positive voltage. As a result, the VCO 6 is always subjected to a pulse modulation at the reference frequency (this phenomenon will be termed "reference leak" hereinafter).

FIG. 6 shows the reference phase signal $f_r$ by (a) and the phase signal $f_p$ by (b) for the output phase signal $f_o$ of 500 MHz and frequency division factor N of 10000, as an example, in the steady state, resulting in a comparator output $f_{pD}$ of 50 kHz, for example, as shown by (c), and a small reference leak R is created. The transition of the output phase signal $f_o$ following a change in the frequency division factor of the programmable frequency divider from N to M until the steady state is restored is generally called "step response".

As described above, the conventional PLL frequency synthesizer implements the phase comparison at the reference frequency, imposing a pulse modulation at the reference frequency on the VCO, 6. Therefore, it is necessary for the LPF 5 to have a low cutoff frequency. Moreover, the output step response following a change in the frequency division factor of the frequency divider until the settlement of steady state is deteriorated.

SUMMARY OF THE INVENTION

A first object of the present invention is to provide a PLL frequency synthesizer in which the pulse modulation at the reference frequency (reference leak) imposed on the VCO is diminished.

A second object of the present invention is to provide a PLL frequency synthesizer in which the settlement of step response is sped up.

in order to achieve the above objects, the inventive PLL frequency synthesizer is designed to operate on multiple reference phase signals produced from a reference phase signal by shifting the phase. The output phase signal of the VCO is compared with these multiple reference phase signals. Accordingly, the frequency of pulse modulation increases apparently, implementing an increased number of phase comparison, and the reference leak is reduced. The LPF can have higher cutoff frequency, and the settlement of step response is sped up.

DESCRIPTION OF THE PREFERRED EMBODIMENTS

Embodiments of the present invention will be described in detail with reference to the drawings.

Figure 1:
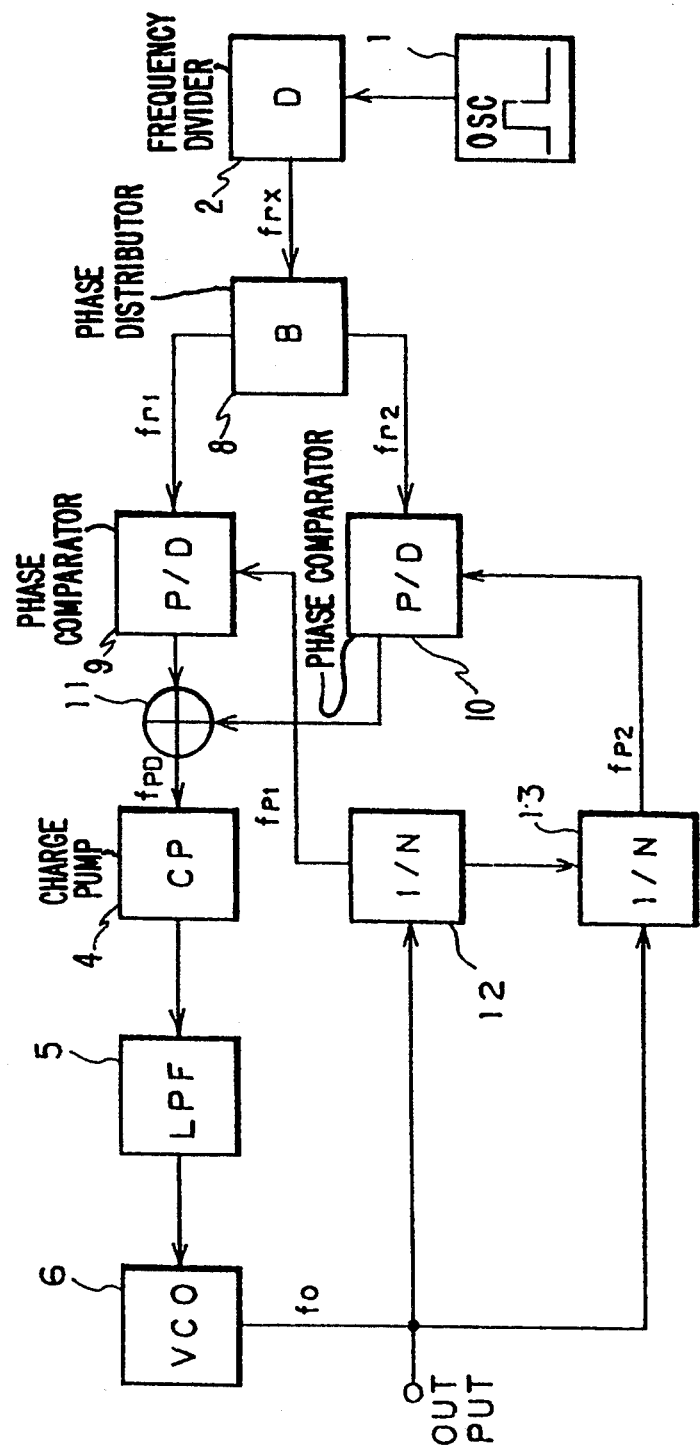
FIG. 1 is a block diagram showing the. PLL frequency synthesizer based on an embodiment of this invention.

FIG. 1 shows in block diagram the arrangement of the PLL frequency synthesizer based on an embodiment of this invention.

Embodiment 1

In FIG. 1, reference numeral 1 denotes a fixed-frequency oscillator, 2 is a frequency divider which divides a constant frequency generated by the oscillator 1 to produce a reference phase signal $f_{rx}$, and 8 is a phase distributor which produces pulse signals $f_{r1}$ and $f_{r2}$ of different phases using the reference phase signal $f_{rx}$. The difference of the phases is a half wavelength as shown by (a), (b) and (c) in FIG. 2.

Indicated by 9 and 10 are phase comparators which compare output phase signals produced by programmable frequency dividers 12 and 13 which will be explained shortly. The phase comparator 9 compares the output phase signal $f_{p1}$ shown by (d) in FIG. 2 with the reference phase signal $f_{r1}$ to produce an output signal shown by (f). The phase comparator 10 compares the output phase signal $f_{p2}$ shown by (e) with the reference phase signal $f_{r2}$ to produce an output signal shown by (g). These phase comparators 9 and 10 produce the output signals alternately as shown by (f) and (g).

Indicated by 11 is an adder which adds the output signals of the phase comparators 9 and 10, 4 is a charge pump which varies its output state in response to the output of the adder 11, 5 is a low-pass filter (LPF) which smoothes the output of the charge pump 4, and 6 is a voltage-controlled oscillator (VCO).

The programmable frequency divider 12 produces the pulse signal $f_{p1}$ at counts N, 2N, 3N, ... pieces of $f_o$ as in the case of the conventional frequency synthesizer, while the programmable frequency divider 13 is designed to produce the pulse signal $f_{p2}$ at counts 3N/2, 5N/2, 7N/2, ... pieces of $f_o$. The reference phase signal $f_{rx}$ of the frequency divider 2 is set equal to $2f_r$.

Next, the operation of the frequency synthesizer of this embodiment will be explained. This PLL frequency synthesizer has two frequency feedback circuits dealing with signals that are out of phase by a half wavelength as mentioned above, and therefore $f_{rx}$ is equal to $2f_r$ in the steady state. Then, $df_{r1}/dt$ is equal to $df_{r2}/dt$ and equal to $df_r/dt$, and all of $f_{r1}$, $f_{r2}$ and $f_r$ are the same frequency.

Figure 2:
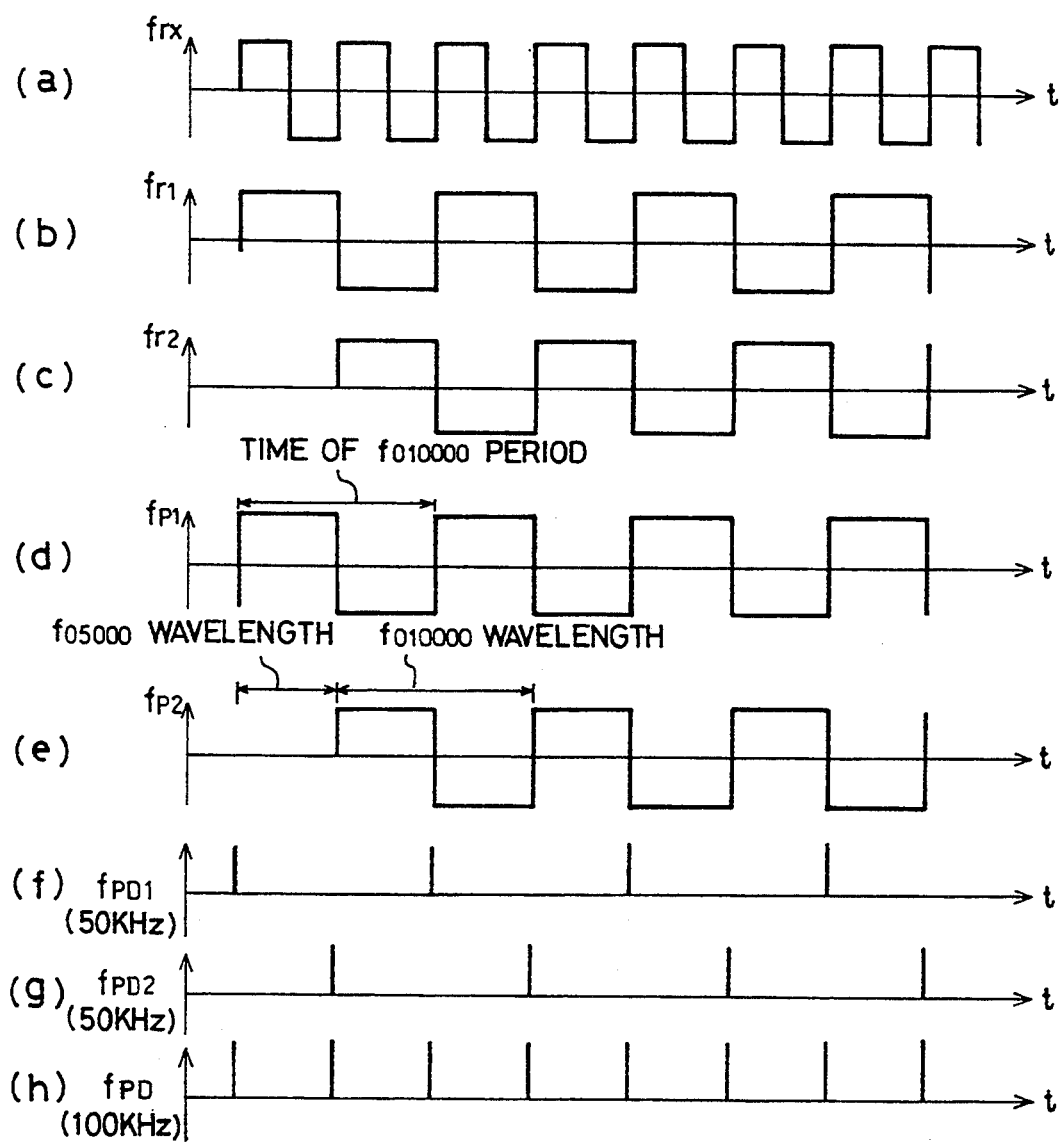
FIG. 2 is a timing chart showing the signals at various portions of the circuit arrangement of FIG. 1.

Accordingly, provided that the system is stable initially, it can be stable continuously merely through the provision of two frequency feedback circuits dealing with signals that are out of phase by a half wavelength as shown by (b)–(g) in FIG. 2.

In addition, the implementation of phase comparison on a multiple-stage basis (two stages in this embodiment) reduces the phase shift at each comparison operation, resulting in a smaller reference leak for the reference frequency $f_r$ as compared with the convention PLL frequency synthesizer. The phase comparison of the signals out of phase by a half wavelength results in a reference leak with a frequency twice the reference frequency $f_r$ as shown by (h) in FIG. 2, allowing the LPF 5 to have a higher cutoff frequency, and the settlement of step response speeds up. The implementation of phase comparison more than once in the transitional state speeds up the settlement of step response as compared with the conventional PLL frequency synthesizer.

Embodiment 2

The PLL frequency synthesizer based on another embodiment of this invention will be explained.

In the preceding embodiment, the programmable frequency divider 13 may not produce pulse outputs at counts 3N/2, 5N/2, 7N/2, and so on in some cases by some reason. This embodiment is intended to let the programmable frequency divider produce pulse outputs at counts X, X+N, X+2N, and so on, where X is an integer nearest to N/2, and consequently the reference leak can be reduced and the settlement of step response can be sped up as in the preceding embodiment.

Figure 3:
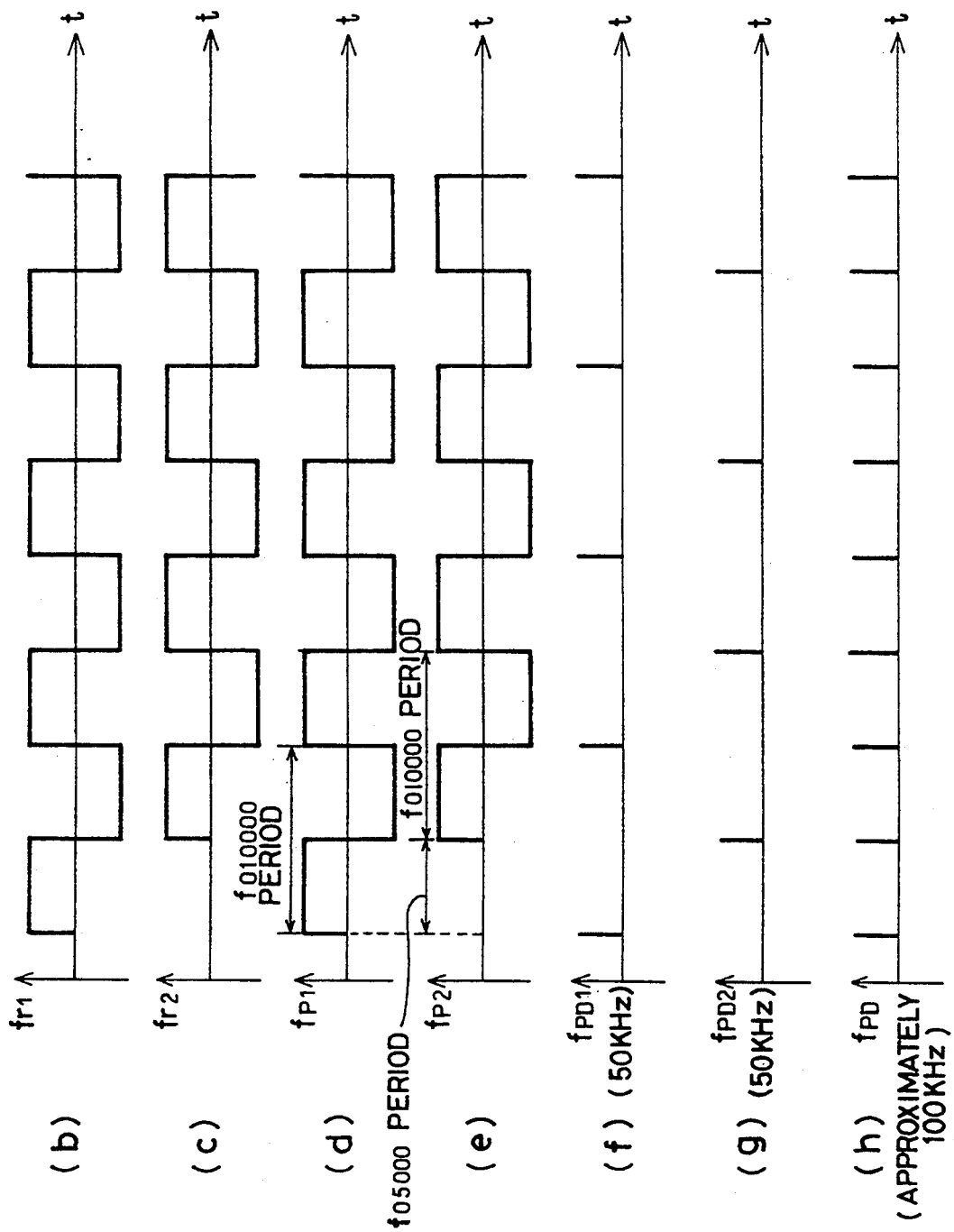
FIG. 3 is a timing chart showing the signals at various portions of the circuit arrangement of FIG. 1 of the case where the output phase signals of the programmable frequency dividers are out of phase with each other.
Figure 4:
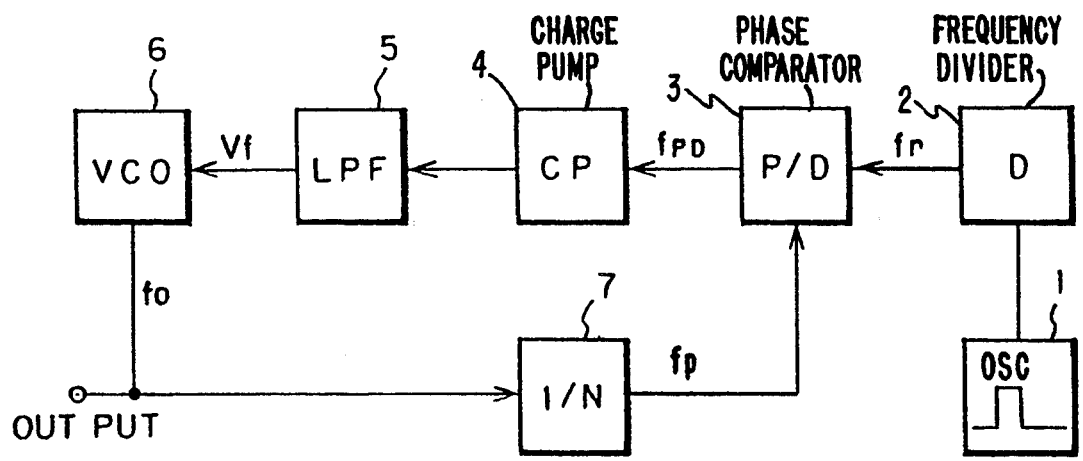
FIG. 4 is a block diagram showing the conventional PLL frequency synthesizer.
Figure 5:
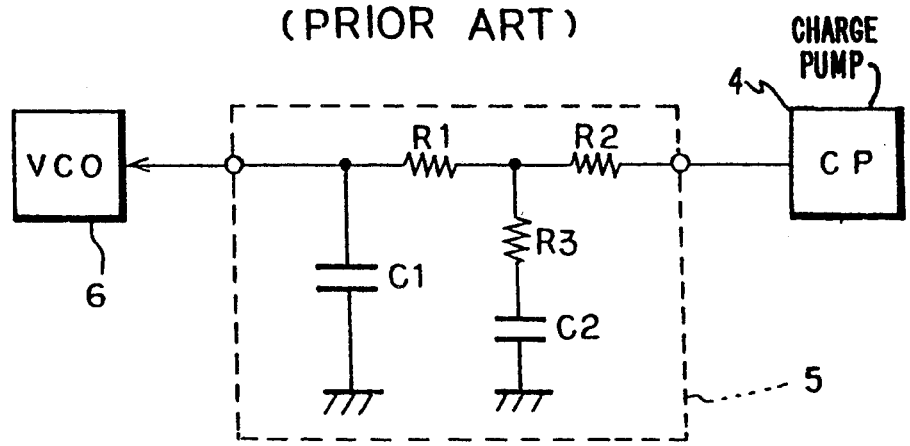
FIG. 5 is a schematic diagram of the low-pass filter used in the circuit arrangement of FIG. 4.
Figure 6:
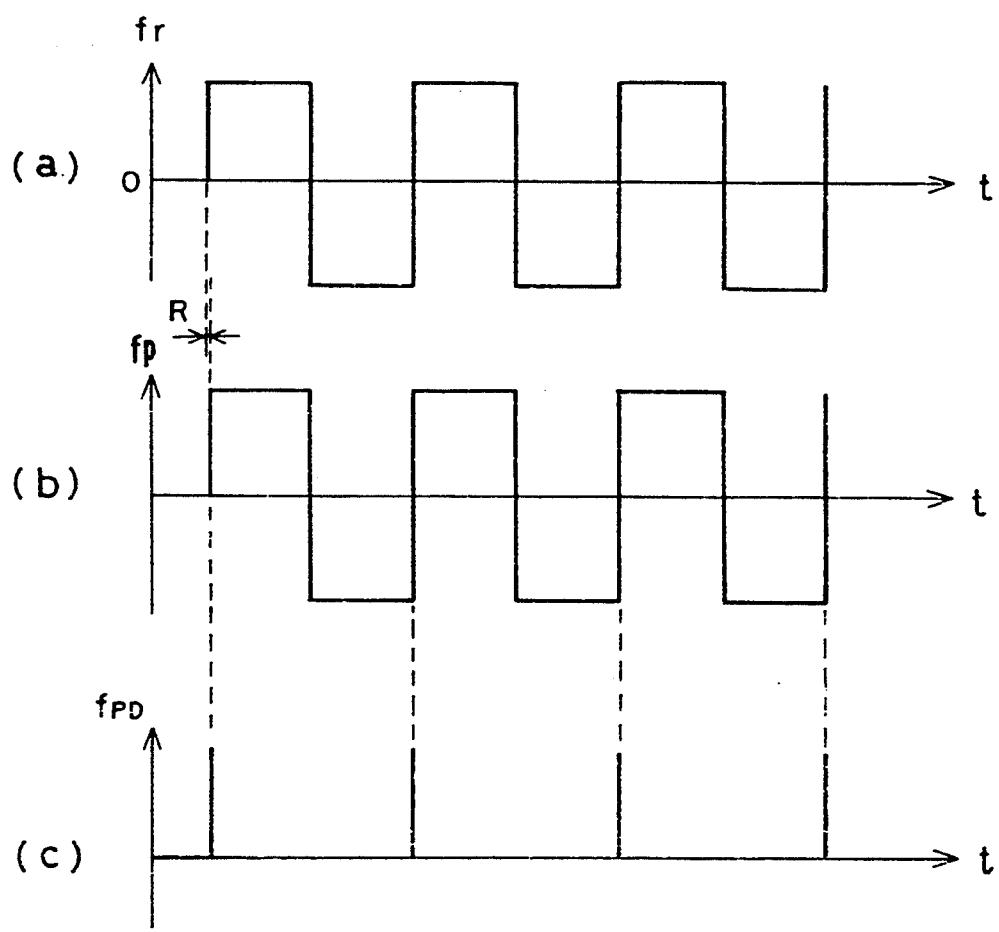
FIG. 6 is a timing chart showing the signals at various portions of the circuit arrangement of FIG. 4.

In case the programmable frequency divider 13 has a frequency division factor of 10001 for example, the reference phase signals $f_{r1}$ and $f_{r2}$ are out of phase with each other by a half wavelength exactly in the steady state as shown by (b) and (c) in FIG. 3. The output phase signals $f_{p1}$ and $f_{p2}$ are out of phase with each other by a half wavelength plus a half period of $f_o$ as shown by (d) and (e), and accordingly the output signals $P_{D1}$ and $P_{D2}$ of the phase comparators 9 and 10 are out of phase with each other by a half wavelength plus a half period of $f_o$ as shown by (f) and (g). As a result, the adder 11 produces an output phase signal $f_{PD}$ as shown by (h). The output phase signal $f_{PD}$ has a frequency approximately equal to 100 kHz. This embodiment based on the scheme of approximation is adopted when the first embodiment described previously cannot be applied, e.g., when the frequency division factor is 10001 and a 5000.5 wavelengths cannot be counted.

What is claimed is:

1. A frequency synthesizer using a phase-locked loop for producing signals of multiple frequencies, comprising:

a voltage-controlled oscillator which generates a signal having a frequency correspondent to an input voltage supplied thereto;

a reference signal oscillator which generates a first reference phase signal that establishes an operational base of said synthesizer;

a phase distributor which produces a second reference phase signal and a third reference phase signal based on said first reference phase signal;

a first frequency divider which divides an output frequency of said voltage-controlled oscillator by a first frequency division factor;

a second frequency divider which divides an output frequency of said voltage-controlled oscillator by a second frequency division factor;

a first phase comparator which detects a phase difference between the second reference phase signal and an output signal of said first frequency divider to produce a first phase difference signal which represents the detected phase difference;

a second phase comparator which detects a phase difference between the third reference phase signal and an output signal of said second frequency divider to produce a second phase difference signal which represents the detected phase difference;

an adder which adds the first and the second phase difference signals;

a charge pump which varies an output state thereof in response to an output of said adder; and a low pass filter which removes the high frequency components above a predetermined frequency from an output signal of said charge pump and supplies a resulting voltage signal to said voltage-controlled oscillator;

said first reference phase signal having a frequency twice as high as the frequency of the second and third reference phase signals;

the phase difference between the second reference signal and the third reference signal being a half wavelength of the first reference signal; and wherein said first frequency divider produces a pulse signal on completion of counting N output pulses of said voltage-controlled oscillator, where N is a natural number representing a frequency division factor, and said second frequency divider produces a pulse signal on completion of counting $(2n+1)N/2$ output pulses of said voltage-controlled oscillator, where n is a natural number.

2. A frequency synthesizer using a phase-locked loop for producing signals of multiple frequencies, comprising:

a voltage-controlled oscillator which generates a signal having a frequency correspondent to an input voltage supplied thereto;

a reference signal oscillator which generates a first reference phase signal that establishes an operational base of said synthesizer;

a phase distributor which produces a second reference phase signal and a third reference phase signal based on said first reference phase signal;

a first frequency divider which divides an output frequency of said voltage-controlled oscillator by a first frequency division factor;

a second frequency divider which divides an output frequency of said voltage-controlled oscillator by a second frequency division factor;

a first phase comparator which detects a phase difference between the second reference phase signal and an output signal of said first frequency divider to produce a first phase difference signal which represents the detected phase difference;

a second phase comparator which detects a phase difference between the third reference phase signal and an output signal of said second frequency divider to produce a second phase difference signal which represents the detected phase difference;

an adder which adds the first and the second phase difference signals;

a charge pump which varies an output state thereof in response to an output of said adder; and a low pass filter which removes the high frequency components above a predetermined frequency from an output signal of said charge pump and supplies a resulting voltage signal to said voltage-controlled oscillator;

said first reference phase signal having a frequency twice as high as the frequency of the second and third reference phase signals;

the phase difference between the second reference signal and the third reference signal being a half wavelength of the first reference signal; and wherein said first frequency divider produces a pulse signal on completion of counting N output pulses of said voltage-controlled oscillator, where N is a natural number representing a frequency division factor, and said second frequency divider produces a pulse signal on completion of counting $X+nN$ output pulses of said voltage-controlled oscillator, where X is an integer nearest to $N/2$, and n is a natural number.

* * * * *